March 18, 1969 L. J. SEVIN 3,434,068

INTEGRATED CIRCUIT AMPLIFIER UTILIZING FIELD-EFFECT TRANSISTORS HAVING PARALLEL REVERSE CONNECTED DIODES AS BIAS CIRCUITS THEREFOR

Filed June 19, 1967 Sheet 1 of 3

INVENTOR

Leonce J. Sevin

BY Gerald B. Epstein

ATTORNEY

United States Patent Office 3,434,068

Patented Mar. 18, 1969

3,434,068

INTEGRATED CIRCUIT AMPLIFIER UTILIZING FIELD-EFFECT TRANSISTORS HAVING PARALLEL REVERSE CONNECTED DIODES AS BIAS CIRCUITS THEREFOR

Leonce J. Sevin, Richardson, Tex., assignor to Texas Instruments Incorporated, Dallas, Tex., a corporation of Delaware Filed June 19, 1967, Ser. No. 647,049

U.S. Cl. 330—19 13 Claims

Int. Cl. H03f 3/42, 3/04

ABSTRACT OF THE DISCLOSURE

A stable, high-gain, integrated circuit amplifier is disclosed, which includes one or more cascaded stages, and which requires no external resistors or capacitors. Each stage includes at least one metal-oxide-semiconductor field effect transistor amplifier element, connected to a load metal-oxide-semiconductor field effect transistor and in a preferred embodiment, biased by diffused junction diodes. The diodes are operated with an essentially zero voltage drop thereacross and may cooperate with a metal-oxide-semiconductor coupling capacitor to provide the requisite time constant at the input of the circuit so as to obtain desired low frequency response characteristics and stable operation. In addition, means are provided in the integrated circuit amplifier for elevating the output voltage produced by the circuit so as to provide a signal which will adequately drive an external load.

The present invention relates generally to amplifier circuits and more particularly is directed to a stable, high-gain, integrated circuit amplifier which requires no external resistors or capacitors.

In typical integrated circuit amplifiers which are capable of providing a high-gain and operating with a reasonable degree of stability, it has been generally desirable to utilize external resistors and/or capacitors in order to maintain a stable operating point within the usual ranges of power supply voltage and temperature. This has been particularly true when it has been desired to achieve a gain of the order of 1,000, while maintaining a stable operating point under conditions of varying temperatures or supply voltages. Furthermore, in order to attain certain low frequency characteristics, such as a cut-off frequency below about 40 Hz. the input coupling circuit, which may comprise a bias network together with an input coupling capacitor, should have a relatively long time constant. Such requirements have been somewhat difficult to achieve, utilizing conventional monolithic-diffused-bipolar integrated circuits, since the maximum practical values of input resistance and coupling capacitance available often limit the time constant to an insufficient value. In accordance with one aspect of the present invention, in order to alleviate such difficulties the low leakage characteristics of metal-oxide-semiconductor field effect transistors and capacitors, as well as the high dynamic resistance of diffused-junction diodes are utilized, so as to attain the requisite long coupling time constant.

In conventional integrated circuit amplifiers it has been the usual practice to utilize external resistors and/or biasing capacitors in order to obtain the desired high values of resistance and capacitance, which are required to attain large values of gain for the desired frequency response. This may detract from the inherent usefulness of such circuits in certain instances due to the size increase, as well as the possible increase in cost. Consequently, in accordance with another aspect of the present invention, a complete integrated circuit amplifier is provided utilizing no external resistors or capacitors which is readily amenable to mass production techniques so that the unit cost of the device may be maintained at a relatively low level.

It is an object of the present invention to provide a stable, high-gain, integrated circuit amplifier which requires no external resistors or capacitors.

It is another object of the present invention to provide a stable, high-gain, integrated circuit amplifier which provides desired gain characteristics over relatively wide ranges of power supply voltage and temperature.

It is a further object of the present invention to provide a high-gain stable integrated circuit amplifier which is durable in use and relatively inexpensive to manufacture.

Other objects and advantages will become readily apparent from the following detailed description and the accompanying drawings wherein.

Briefly, in accordance with the present invention, an integrated circuit amplifier is provided which does not require the provision of external components, such as capacitors or resistors, but yet in one preferred embodiment is adaptable for achieving a stable gain of the order of approximately 1,000, with a lower cut-off frequency below 40 Hz. Although it has been possible in certain instances to fabricate a monolithic integrated circuit which provides a gain of 1,000, using prior art techniques, certain problems were present in certain instances in achieving a stable operating point, when the power supply voltage and temperature were varied to any extent. A further difficulty which was present in certain instances in conventional monolithic integrated circuit amplifiers was due to the difficulty of obtaining relatively high values of resistance and capacitance. For example, practically speaking, maximum values of R and C have been approximately 200 kilohms and 20 picofarads, respectively. As a result of such limitations, the time constant of the input coupling capacitor and bias network utilized for driving the active elements had been limited to approximately 4 microseconds, while a time constant of the order of 4 milliseconds was desired in order to achieve the requisite cut-off frequency below 40 Hz.

However, in accordance with the present invention, metal-oxide-semiconductor transistor amplifier elements and metal-oxide-semiconductor capacitors, as well as metal-oxide-semiconductor load resistors are employed in conjunction with diffused-junction diodes, having a high dynamic resistance, in order to achieve the requisite long coupling time constant and the requisite stable operation.

Figures 1, 3, 4:
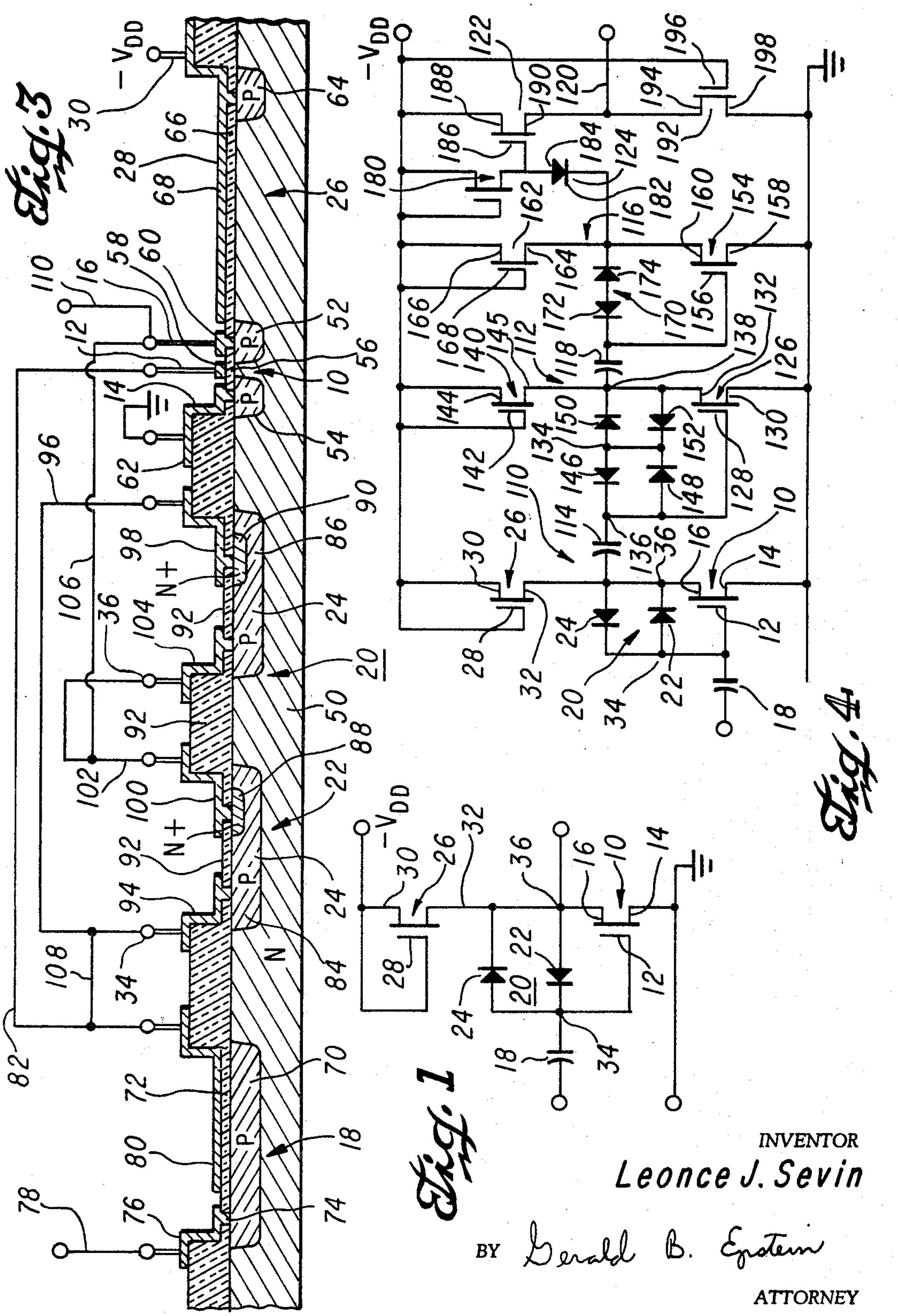
FIGURE 1 is an electrical schematic circuit diagram of a single stage of an integrated circuit amplifier in accordance with the present invention.
FIGURE 3 is a vertical sectional view taken through an integrated circuit amplifier constructed in accordance with the principles of the present invention, and as illustrated schematically in FIGURE 1.
FIGURE 4 is an electrical schematic circuit diagram of a multi-stage integrated circuit amplifier in accordance with the present invention.

Referring now to the drawings, and particularly to FIGURE 1, a single stage of an amplifier circuit in accordance with the present invention, is illustrated. The circuit illustrated generally includes a metal-oxide-semiconductor field effect amplifier transistor 10, hereinafter referred to as an MOS-FET amplifier, having a gate 12, a source 14, and a drain 16. A metal-oxide-semiconductor coupling capacitor 18, hereinafter referred to as an MOS coupling capacitor is connected to the gate 12 of the MOS-FET amplifier and serves to supply input signals to the transistor 10, which functions as an amplifier element. In addition, a bias network 20 including a pair of parallel reverse connected diodes 22 and 24 is connected between one plate of the capacitor 18 and the drain 16 of the amplifier transistor 10, while a metal-oxide-semiconductor field-effect load transistor 26, hereinafter referred to as an MOS load resistor, having a gate 28, a drain 30 connected to the gate, and a source 32 connected to the drain 16 of the MOS amplifier transistor 10 and to the bias network 20 is provided. The MOS load resistor 26 is functionally equivalent to a very high impedance resistor, and it is arranged to adjust the gain of the MOS amplifier transistor. A bias is applied to the gate of the load resistor 26 by an external power supply, represented by the symbol $-V_{DD}$, as shown.

The bias network 20 and its mode of connection to the amplifier transistor 10 is an important feature of the present invention and generally includes an input terminal 34, which is connected in parallel relationship with the coupling capacitor 18 and with the gate 12 of the amplifier transistor 10, and also an output terminal 36, which is connected in parallel relationship with the source 32 of the load resistor 26 and with the drain 16 of the amplifier transistor 10. In addition, the diodes 22 and 24 are connected in parallel with each other and arranged such that the cathode of one is connected to the anode of the other. Consequently, it may be seen that the diodes 22 and 24 by virtue of being connected in reverse parallel relationship between the gate 12 and the drain 16 provide the same voltage level at the gate and at the source of the amplifier transistor 10. Thus, the bias network 20 operates with essentially zero volts across the diodes 22 and 24, and as a result the voltage applied at the gate 12 and the voltage applied at the drain 16 are substantially equal. It may be seen that the diodes 22 and 24, thus, function as feedback diodes to ensure that substantially the same voltage level is present at the input 34 and at the output 36 of the bias network 20. It may be noted that, since biasing of the amplifier transistor 10 is effected by operating the bias network with essentially zero volts thereacross, proper biasing of the amplifier transistor 10 is primarily dependent upon the leakage currents of the diodes 22 and 24 being substantially larger than the dielectric leakage of the parallel combination of the gate 12 of the amplifier transistor 10 and the plate of the capacitor 18 which is coupled thereto.

In addition to leakage-biasing the amplifier transistor 10, the diodes 22 and 24 also perform a highly advantageous limiting or protective function, serving as a voltage clamp across the gate-to-drain of the amplifier transistor 10. In this connection, since the diodes are connected in reverse parallel relationship, if a large input transition signal were to be applied across the bias network 20, which might tend to drive a particular diode into cutoff, the bias network by virtue of the reverse parallel connection tends to automatically preclude such an occurrence by limiting the maximum voltage which may appear. Such a limiting function is highly advantageous, since the recovery time of the network is dependent upon the diode time constant, and in many instances could be excessively long, and result in the circuit being forced out of operation for an undesired time interval.

Figure 2:
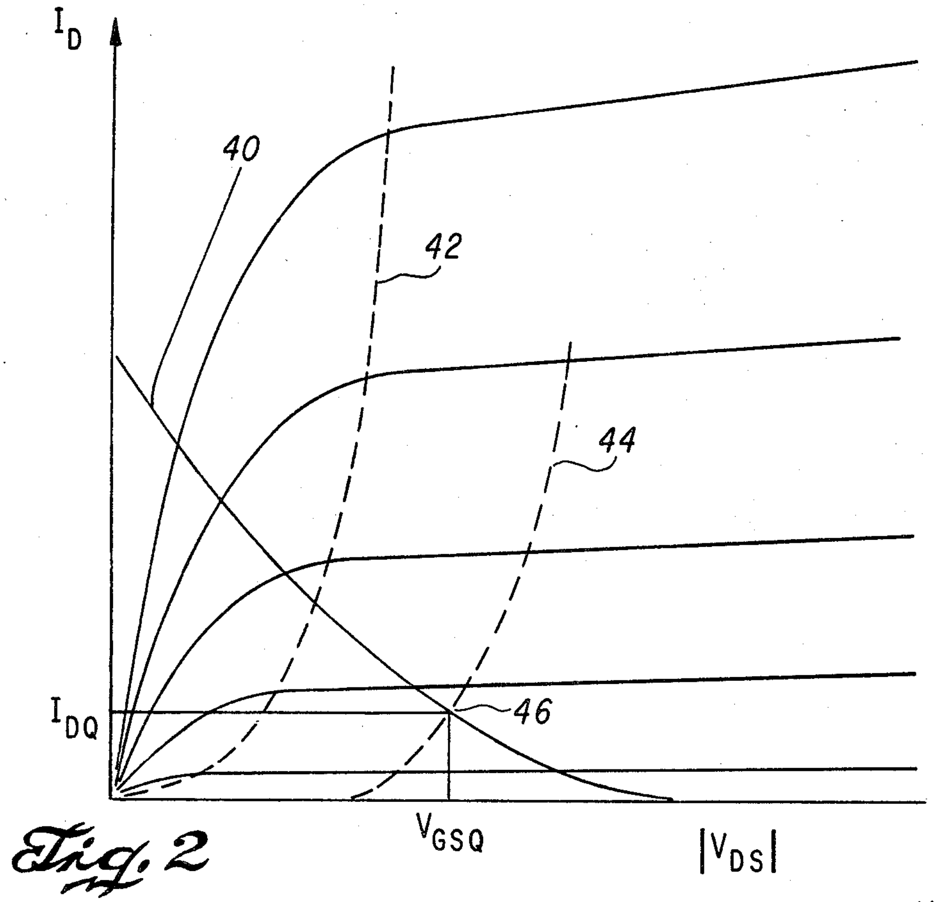
FIGURE 2 is a graph, showing the drain characteristics of a metal-oxide-semiconductor field effect transistor amplifier element and the load line defined by a metal-oxide-semiconductor load transistor connected to such an amplifier element, as well as illustrating a method of determining the quiescent point of an integrated circuit amplifier, such as that illustrated in FIGURE 1.

Referring to FIGURE 2, the drain characteristic curves of the amplifier transistor 10 are illustrated, drain-to-source voltage $V_{DS}$ being plotted on the horizontal axis, vs. output current $I_D$ being plotted on the vertical axis, at various levels of gate voltage $V_G$. In addition, a load line 40 is superimposed representing the characteristics of the load resistor 26. Since the load resistor 26 is a metal-oxide-semiconductor resistor, its load line 40 is non-linear and has a square law characteristic. Consequently, the square law characteristics of the load resistor 26 and of the amplifier transistor 10 tend to offset each other, and result in an amplifier gain, which remains substantially constant over a relatively large input voltage swing and over a relatively large temperature range. In addition, since the drain and gate voltages of the amplifier transistor 10 are maintained equal, as previously explained, assurance is provided that the operating point of the amplifier transistor will always be the threshold voltage of the amplifier transistor greater than the boundary line dividing the pentode region from the triode region as shown in FIGURE 3. Such a boundary line is designated by the numeral 42 (with the region to the left of the boundary line representing the area in which the amplifier transistor functions similarly to a triode and the region to the right of the boundary line representing the area in which the device functions similarly to a pentode). The boundary line 42 represents the locus of points at which $V_{DS}=V_{GS}-V_T$, where $V_{DS}$=the drain-to-source voltage, $V_{GS}$=the gate-to-source voltage, and $V_T$=the threshold voltage of the amplifier transistor 10. In addition, the curve designated by the numeral 44 is obtained by adding $V_T$ to each point on the curve 42 and, thus, represents the locus of points, which are $V_T$ greater than the quantity $V_{GS}-V_T$ or the points where $V_{DS}=V_{GS}$, which describes the operation of the present amplifier transistor. Accordingly, the quiescent point 46 of the combination of amplifier transistor 10 and the load resistor 26 may be readily determined by merely noting the point at which the curve 44 intersects the load line 40, and is shown in FIGURE 2 with the quiescent drain current, being represented by the symbol $I_{DQ}$, and the quiescent gate-to-source voltage being represented by the symbol $V_{GSQ}$.

Referring now to FIGURE 3, wherein like elements have the same reference numeral as in FIGURE 1, a sectional view of the integrated circuit amplifier, shown schematically in FIGURE 1, is illustrated in detail. Preferably, an N conductivity-type silicon substrate is provided. The amplifier transistor 10 is provided by forming a first P conductivity-type region 52 beneath one surface of the substrate. This region 52 extends a predetermined distance into the substrate and emerges at the upper surface thereof so as to facilitate making electrical contact with this region, which defines the drain 16. Similarly, the source 14 is formed by a second P conductivity-type region 54 beneath the upper surface of the substrate relatively closely laterally spaced from the region 52. This relatively close spacing aids in increasing the gain of the combination of the amplifier transistor 10 and the load resistor 26, since the gain of the combination is inversely proportional to the length of the gate, which depends on the spacing between the drain and source regions. Thus, the smaller this length or spacing, the greater the gain of the combination. In addition, an insulating oxide layer 56 is disposed on the surface of the substrate between the first and second P conductivity-type regions 52 and 54, preferably overlapping a portion of these P type regions as shown in FIGURE 3. The gate portion 12 is then completed by disposing a layer 58 of metal contact material on the surface of a predetermined portion of the insulating oxide layer 56, this portion being defined by that part of the insulating oxide layer extending between the facing ends of the P conductivity-type regions 52 and 54. Similarly, the source 16 is completed by disposing a layer of contact metal 60 in communication with the P conductivity-type region 52 as shown, while the drain 14 is completed by disposing a layer of contact metal 62 in communication with the P conductivity-type region 54. In addition, the layer of contact metal 62 is preferably coupled to ground.

It should be noted that substantially the entire surface of the substrate 50 is covered by an insulating oxide layer comprising silicon dioxide except for those portions at which contact is to be made to various regions of the devices formed in the substrate. Such contact is made by forming small apertures in preselected areas of the oxide layer, utilizing conventional mask and etch techniques. Consequently, expanded area contacts may be provided which are in electrical communication with extremely small areas of the devices formed in the substrate, but which are then extended over a portion of the oxide layer so as to facilitate connections with external conductors. In addition, the oxide insulating layer serves another relatively important function. As shown in FIGURE 3 all of the PN junctions emergent at the surface of the substrate 50 are overlaid by portions of the insultating oxide layer. Thus, the oxide layer serves to passivate the emergent junction and to reduce undesired leakage currents and further serves to protect the junctions against the introduction of undesired impurities.

The load resistor 26, which is coupled to the amplifier transistor 10 is formed in a manner generally similar to that described in connection with the amplifier transistor. The source 32 of the load resistor 26, as previously mentioned, is in common with the drain 16 of the amplifier transistor 10. Accordingly, the source 32 generally comprises the P conductivity-type region 52. The drain 30 of the load resistor 26 is formed by a third P conductivity-type region 64, formed beneath the surface of the substrate 50, but spaced a substantial lateral distance from the source region 52. This relatively large spacing between the source and drain of the load resistor is for purposes of maintaining a relatively high impedance, as well as to aid in increasing the gain of the combination of the amplifier transistor 10 and the load resistor 26, since the gain of this combination is directly proportional to the length of the gate region or the spacing between the source and drain of the load resistor. As a result of thus controlling the gain by the geometry of the amplifier 10 and the load resistor 26, the circuit remains relatively unaffected by variations in the supply voltage $V_{DD}$.

The gate 28 of the load resistor 26 is formed by disposing the layer 66 of insulating oxide on the surface of the substrate 50, extending between the P conductivity-type region 52 and the P conductivity-type region 64, preferably extending a slight distance over the emergent surfaces of the P conductivity-type regions, as shown. The gate 28 is completed by disposing a layer of contact metal 68 over a predetermined portion of the insulating oxide layer 66 in the region extending between the P conductivity-type region 52 and the P conductivity-type region 64. In addition, since the gate 28 and the drain 30 are connected in common with each other in order to form the load resistor, the layer of contact metal 68 is arranged to extend through the oxide layer 66 and into communication with a predetermined portion of the P conductivity-type region 64, which forms the drain 30. The metallic contact metal 68 may then be suitably connected to the negative voltage supply $V_{DD}$.

In forming the metal-oxide-semiconductor coupling capacitor 18, at the input of the circuit, another P conductivity-type region 70 is formed beneath the surface of the substrate 50 and extends a predetermined distance from the upper surface thereof. The P conductivity-type region 70 has a substantially greater lateral dimension in comparison to the previously described P conductivity-type region 70, since it forms one of the plates of the capacitor 18. A silicon dioxide insulating layer 72 is disposed over the surface of the substrate from which the P type region 70 emerges and also extends a predetermined distance beyond the emergence of the P-N junction at the surface. The oxide layer is provided with a relatively small aperture 74 to permit a layer of metallic contact material 76 to electrically contact the P conductivity-type region 70. Thus, a plate of the capacitor structure is formed and is of P conductivity-type semiconductor material, being adapted to be connected to a source of input signals through an input electrode 78.

The other plate of the capacitor structure is formed by depositing a layer of metal 80 over a predetermined portion of the silicon dioxide insulating layer 72 in a manner such that a majority of the P conductivity-type material 70 is overlaid by the contact metal 80, although separated therefrom by the insulating oxide, which serves as the capacitor dielectric. The layer of metal 80 thus forms the opposite plate of the capacitor structure 18. This metallic plate 80 is in turn connected to the gate 12 of the amplifier transistor through a conductor 82 and thus serves to couple the capacitor 18 to the gate 12 of the amplifier transistor 10.

The particular mode of connection of the capacitor 18 in the circuit is an important feature of the present invention. More particularly, the plate of the capacitor, formed of the P conductivity-type semiconductor material 70 is connected to the electrode 78 which supplies the input signals to the circuit, while the metallic plate 80 of the capacitor, which is separated from the region 70 by the oxide insulation 72, is connected to the gate 12 of the amplifier transistor 10. As one result of this orientation of the capacitor plates, the requisite D-C isolation and proper biasing are effected.

The bias means 20, as previously described, is connected at its input 34 to the capacitor 18, and, as shown in FIGURE 3, is connected to the metallic plate 80 of the capacitor. The diodes 22 and 24 may also be formed by conventional photomasking and diffusion techniques and each include a P conductivity type layer 84 and 86 respectively, which form the anode of each of the diodes. The cathodes of the respective diodes are formed by a relatively small area N+ region 88 and 90, which is diffused into the surface of the respective P type regions 84 and 86. As shown in FIGURE 3, the P-type regions 84 and 86 are formed to extend beneath the surface of the substrate 50, emerging at the surface thereof, while the N-type regions 88 and 90 are similarly formed beneath the surface of the respective P conductivity-type regions occupying a relatively small portion thereof, and also extend to the surface of the substrate, thereby facilitating making electrical contacts to the various regions.

The diffused-junction diodes, which are thus formed, have a relatively high dynamic resistance and low bulk leakage current which is advantageous in effecting biasing of the amplifier transistor 10. It should also be noted that the P-N junction diodes described above actually form N transistors with respect to the substrate. However, the devices are made functionally equivalent to diodes by making the base width, represented by the respective P-type regions extremely wide, so as to make the $H_{FE}$ low and the $BV_{CEO}$ relatively high. Thus, although these devices are structurally transistors, they are functionally equivalent to diodes and are referred to and utilized as diodes.

The emergent surface areas of the P conductivity-type regions 84 and 86 and the N+ conductivity regions 88 and 90 are covered by another portion 92 of silicon dioxide insulation, deposited over the surface portions of the substrate 50 from which these regions emerge. In addition, apertures are suitably arranged extending through this portion of the silicon dioxide insulation in order to permit contact to be made to the respective regions of the diode so as to facilitate interconnection of the diodes with the remainder of the circuit. A metallic contact 94 is disposed on the surface of the insulation, and is arranged to extend into electrical communication with a portion of the P conductivity-type region 84. This metallic contact 94 in turn is coupled through a conductor 96 to another layer of metallic contact material 98, which is also disposed over the surface of the silicon dioxide insulation, and is in electrical communication with the cathode or N+ region 90 of the diode 24. Similarly, a metallic contact layer 100 is disposed over a portion of the silicon dioxide insulation, and extends into electrical contact with a portion of the N+ conductivity-type region 88, which forms the cathode of the diode 22, and is in turn connected through a conductor 102 to a metallic contact layer 104, which is in electrical communication with the P-type layer or anode 86 of the diode 24.

Connection of the output 36 of the bias network 20 to the amplifier transistor 10 is provided by a conductor 106 coupled to the metallic contact layer 100, which is coupled to the anode of the diode 22 and to the cathode of the diode 24 for connecting these portions of the respective diodes to the drain 16 of the amplifier transistor 10. In addition, the gate 12 of the amplifier transistor 10 is connected through the conductor 82 to the metallic plate 80 of the capacitor 18 which in turn is connected through a conductor 108 to the input 34. Thus, the diodes 22 and 24 are connected in reverse parallel relationship between the gate 12 and the drain 16 of the amplifier transistor. Similarly, since the diodes are connected in parallel relationship with the drain 16 of the amplifier transistor 10, they are also connected in parallel relationship with the source 32 of the load resistor 26, which, as previously explained, is in common with the drain 16 of the amplifier transistor. Amplifier output signals are then supplied by an output electrode 110, which is connected to the drain 16 of the amplifier transistor, as shown.

The aforementioned P conductivity-regions are generally formed utilizing conventional photomasking and diffusion techniques and may be formed simultaneously in a single step or utilizing separate steps in an appropriate process. Similarly, the oxide insulating layer, which preferably comprises silicon dioxide, may be thermally grown or otherwise formed in a conventional manner. The contact metal may be formed utilizing conventional photoengraving techniques, such as initially depositing contact metal over the entire surface of the silicon dioxide insulating layer and then using various masking and etching steps or by other suitable techniques.

It should again be noted that the integrated circuit illustrated in FIGURE 3 and described above corresponds to the electrical schematic circuit diagram, shown in FIGURE 1, and may, in certain instances, represent a complete amplifier circuit, or alternatively may represent a single stage of a multi-stage cascaded amplifier, such as that illustrated in FIGURE 4.

In FIGURE 4, a multi-stage cascaded amplifier is provided, which utilizes a number of stages substantially similar to that illustrated in FIGURE 1, and which is also fabricated in integrated circuit form. It should be readily understood that the circuit illustrated in FIGURE 4 may be conveniently fabricated in a manner substantially similar to that described in connection with the description of the integrated circuit amplifier described in conjunction with FIGURE 3. However, for the sake of simplicity the actual physical embodiment of the integrated circuit is not illustrated in detail since its construction is believed to be readily apparent in view of the explanation provided in connection with the description of FIGURE 3.

Referring in detail to the embodiment of the multi-stage amplifier illustrated in FIGURE 4, a three-stage amplifier is shown for purposes of illustration, which is adapted to effect an amplification of approximately 1000, and which is suitably arranged for driving an external load, but which requires no external capacitors or resistors.

Generally, in the amplifier illustrated in FIGURE 4, a first stage 110 is provided, which is substantially identical to the amplifier circuit illustrated in FIGURES 1 and 3, with a second stage 112 being coupled to the first stage through an MOS coupling capacitor 114 and a third stage 116 being coupled to the second stage by another metal-oxide-semiconductor coupling capacitor 118. In addition, the third stage is coupled to an output electrode 120, which is adapted to be connected to an external load. The output electrode is preferably coupled to the third stage by a source follower circuit 122, which is connected to the third stage 116 through a breakdown diode 124.

The second stage 112, which is connected to the first stage 110 through the coupling capacitor 114 similarly includes a second metal-oxide-semiconductor amplifier transistor 126, having a gate 128, a source 130 and a drain 132, and is substantially similar to the amplifier transistor 10. A bias network 134 is also provided having an input end 136 and an output end 138. The input end 136 is coupled to the capacitor 114, and, as previously explained, is preferably coupled to the metallic plate of the capacitor 114, while the opposite plate of the capacitor, which is formed of semiconductor material, is connected to the output of the preceeding stage, i.e, the drain 16 of the amplifier transistor 10. The input end 136 is also connected in parallel relationship with the gate 128, as well as with the capacitor 114, while the output end 134 is connected to the drain 132 of the second amplifier transistor 126. In addition, a metal-oxide-semiconductor field effect transistor load or resistor 140 is also connected in parallel with the drain 132 of the second amplifier transistor 126 and with the output 138 of the bias network. The load resistor 140 is generally similar to the load resistor 26 and also includes a gate 142 and a drain 144 connected in common with each other and with a negative voltage supply $V_{DD}$. The load resistor 140 further includes a source 145, which is connected to the drain 132 of the second amplifier transistor and to the output 138 of the bias network.

The bias network 134 is generally similar to the bias network 20, but includes two pairs of reverse parallel connected diodes connected in parallel with each other, rather than a single pair as provided in the first stage 110. By thus providing two pairs of parallel reverse connected diodes this bias network permits the second stage 112 to produce approximately twice the output signal swing of the first stage 110. In this connection, the bias network 134 includes a diode 146 connected in reverse parallel relationship with a diode 148 and also includes a diode 150 connected in reverse parallel relationship with another diode 152 with the diodes 150 and 152 also being connected in parallel with the diodes 146 and 148, as shown. By virtue of the reverse parallel connection of the diodes between the drain and gate of the second amplifier transistor 126, the bias network 134 again operates with substantially zero volts thereacross and biasing of the second amplifier transistor 126 is effected in a manner substantially similar to the biasing of the first amplifier transistor 10, with the drain and gate voltage of the second amplifier transistor 126 being substantially equal to each other.

The amplified output signal, which is produced at the output of drain 132 of the second amplifier transistor 126, is then coupled to the third stage 116 through another metal-oxide-semiconductor coupling capacitor 118, as previously mentioned. The third stage 116 also includes a metal-oxide-semiconductor field effect transistor 154, having a gate 156, a source 158, and a drain 160. This third amplifier transistor 154 is also connected at its output or drain 160 to another metal-oxide-semiconductor load transistor of resistor 162. The load resistor 162 is provided with a source 164 which is connected to the third amplifier 154 and is further provided with a drain 166 and a gate 168 connected in common with the drain, with the drain and gate being coupled to the negative voltage supply $V_{DD}$.

A biasing network 170 is also provided for the third amplifier transistor 154 and is similarly connected between its gate 156 and its drain 160. The biasing network is similarly arranged to operate at essentially zero volts between its input and output and generally includes a pair of reverse series connected diodes 172 and 174. The diodes 172 and 174 are connected anode-to-anode with the cathode of each being connected to the gate 156 and the drain 160 respectively of the third amplifier transistor 154. Since only the diode leakage current is present, the diodes 172 and 174 assure that essentially a zero voltage level is present between the gate and the drain of the third amplifier transistor. In addition, since the diodes 172 and 174 are connected in series apposition, a much larger output signal swing is provided at the output or drain of the third amplifier transistor 154, limited by the reverse breakdown voltages of the diodes 172 and 174.

The output of the third amplifier transistor 154 is then supplied to the breakdown diode 124, which is connected in parallel relationship with the input of the source follower output stage 122 and with another metal-oxide-semiconductor load resistor 180, which is similar to the previously described metal-oxide-semiconductor load resistors. The breakdown diode 124 includes a cathode 182, which is connected to the drain 160 of the amplifier transistor 154 and also includes an anode 184 which is connected in parallel to a gate 186 of the source follower 122 and with the load resistor 180.

Very generally, the breakdown diode 124 is provided primarily for the purpose of elevating the voltage level of the output signal provided at the drain 160 of the third amplifier 154 so as to provide a sufficiently high voltage level to allow the source follower transistor 122 adequate voltage swing without cut off. In the illustrated embodiment, the breakdown voltage of the base-emitter breakdown diode is approximately five volts.

The source follower transistor 122 also includes a drain 188 which is connected in parallel relationship with the load resistor 180 and the negative voltage supply $V_{DD}$. Consequently, the load resistor is connected between the gate and drain of the source follower transistor and together with the supply voltage $-V_{DD}$ provides the requisite bias. In addition, the source follower transistor includes a source 190, which is connected in parallel with the output electrode 120 and with a source follower load transistor 192 having a drain 194 which is connected to the source 190 of the source follower transistor and also having a gate 196 which is connected in parallel relationship with the drain 188 and the negative voltage supply $V_{DD}$. The source follower load transistor also has a source 198, which is connected to ground as shown. The provision of the source follower is particularly advantageous in the illustrated embodiment since it generally serves to provide adequate driving capability to drive an external load, but does not effect a phase reversal of the output signal. Furthermore, the gain of the source follower is close to unity in the illustrated embodiment, since its load resistor, i.e., the load transistor 192, has a relatively high input impedance. The source follower is also advantageous because it has a relatively low output impedance, while providing a large output signal swing.

Thus, a multi-stage cascaded integrated circuit amplifier circuit has been described, which is capable of producing a desired level of gain and which is relatively stable. Operation is relatively unaffected by changes in the supply voltage, since the supply voltage is coupled through extremely high impedance metal-oxide-semiconductor load transistors or resistors which tend to readily compensate for variations in power supply. In addition, the frequency response characteristics of the circuit may be conveniently selected to be such that the circuit performs adequately even under adverse temperature conditions. Furthermore, the gain of the various stages can be conveniently selected by merely appropriately adjusting the mask geometries during the fabrication of the metal-oxide-semiconductor amplifier and load transistors, since, as previously explained, gain is inversely proportional to the length of the gate channel of the amplifier transistor and directly proportional to the length of the gate channel of the load transistor or resistor.

The level shift effect by the provision of the breakdown diode, which provides sufficient driving potential for the source follower stage is an important feature of the illustrated embodiment since it enables the source follower stage to adequately drive an external load without the possibility of current cut-off occurring as a result of insufficient drive. In operation, if the third amplifier stage operates at a D-C level of approxiately one threshold voltage, the voltage which appears at the gate of the source follower will be approximately one threshold voltage, plus the breakdown voltage of the breakdown diode. It should, of course, be noted that in this analysis absolute magnitudes are referred to since all polarities under consideration are actually negative polarities. The D.C. output level of the source follower is then approximately equal to the breakdown voltage of the breakdown diode, which generally permits an adequate output voltage swing. By utilizing this particular circuit arrangement, quite satisfactory results are normally achieved.

Figure 5:
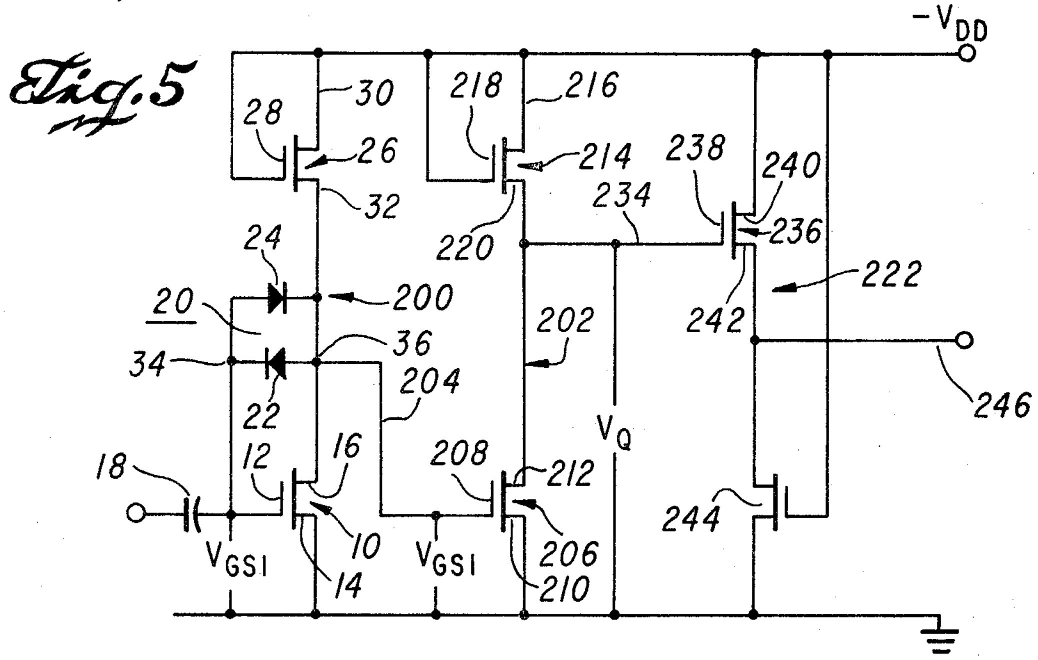
FIGURE 5 is an electrical schematic circuit diagram of an alternate embodiment of an integrated circuit amplifier in accordance with the present invention.

However, in certain instances it may be desirable to effect an elevation or upward shifting of the voltage level of the output provided by the multi-stage integrated circuit amplifier, while utilizing direct coupling between the stages rather than utilizing metal-oxide-semiconductor coupling capacitors and a breakdown diode. Such an alternative embodiment of the invention is illustrated in FIGURE 5. To aid in the analysis of this alternate embodiment of the present invention, reference is also made to a graph of the input voltage $V_{GS}$ (absolute magnitude) against the output voltage $V_{DS}$ (absolute magnitude), as shown in FIGURE 6.

The embodiment illustrated in FIGURE 5 generally includes a first stage 200 which is substantially identical to the first stage of the circuit set forth in FIGURE 3. In addition, a second amplifier stage 202 is provided and is directly coupled to the output or drain 16 of the first amplifier stage through a conductor 204. The second amplifier stage 202 generally includes a metal-oxide-semiconductor field effect transistor amplifier 206, having a gate 208 directly connected to the drain 16 of the preceeding stage through the conductor 204, a source 210, connected to ground, and a drain 212, which is connected to a metal-oxide-semiconductor load transistor or resistor 214. The load resistor 214 includes a drain 216 and a gate 218 connected in common with each other and coupled to a negative voltage supply $V_{DD}$. The load resistor 214 also includes a source 220, which is connected in parallel with the drain 212 of the amplifier transistor 206, and is also directly coupled to a succeeding source follower stage 222, which serves as the output of the amplifier circuit.

Biasing of the first stage 200 is accomplished by the provision of the bias means 20, connected between the gate and drain of the amplifier transistor 10 so that the voltage at the drain 16 is substantially equal to the voltage at the gate 12, as previously explained. Thus, the voltage, represented by the symbol $V_{GS1}$ across the gate to source, of the amplifier transistor 10 will be equal to the voltage applied across its drain to source or output, which in turn will be equal to the voltage applied across the gate 208 to source 210 of the second amplifier transistor 206. Consequently, the voltage $V_{GS1}$ is applied at both the input of the amplifier transistor 10 and at the input of the amplifier transistor 206. This is an important feature of the embodiment illustrated in FIGURE 5.

Figure 6:
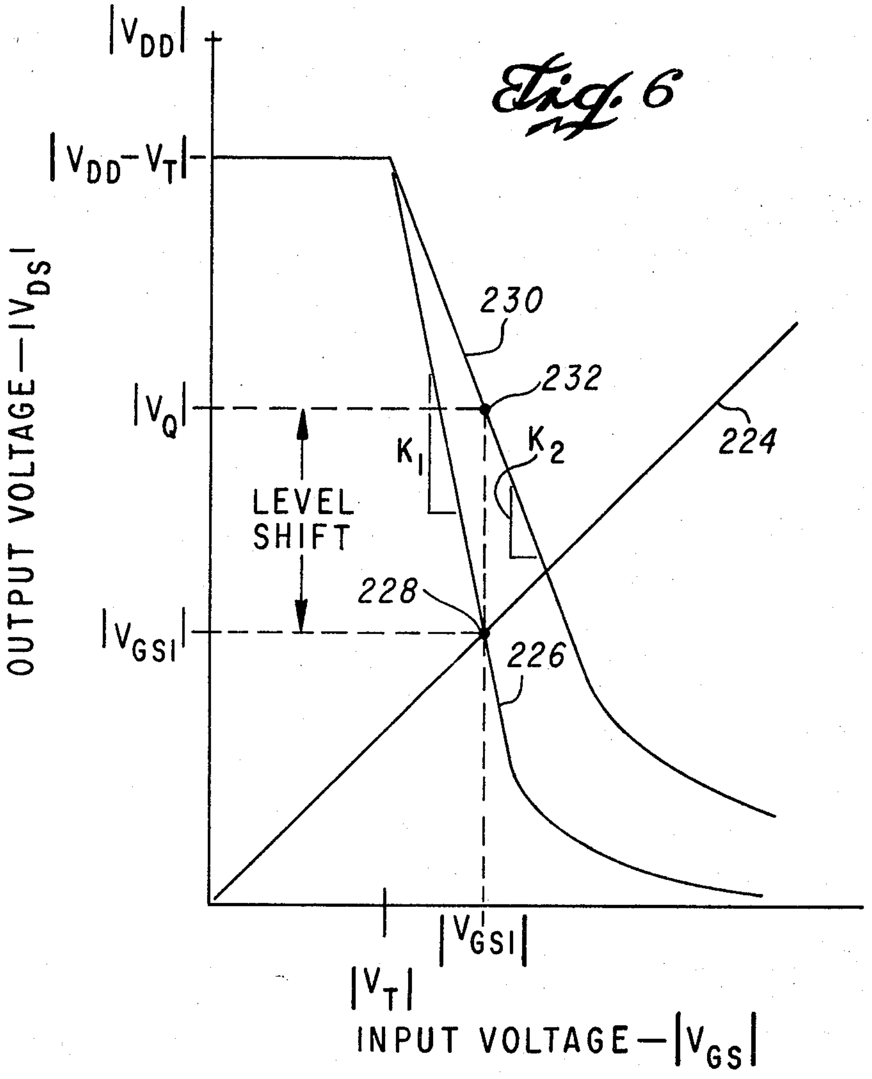
FIGURE 6 is a graph of the voltage transfer characteristics of the circuit illustrated in FIGURE 5.

Since the voltage applied between the gate and source of the amplifier transistor 10, i.e., its input voltage, is equal to the voltage applied between the drain and source of the transistor 10, i.e. ,its output voltage, the bias point of the amplifier 10 may be located, referring to FIGURE 6, by initially drawing a straight line 224 with a slope of unity extending through the origin. The point of intersection of this straight line with the voltage transfer curve 226 of the amplifier transistor 10 defines the bias point 228 of the first stage 200. At this bias point the input voltage will be equal to the output voltage, as represented by the magnitudes $V_{GS1}$ on both the horizontal and vertical axes of the graph. As further shown in FIGURE 6, the gain of the first stage 200 is represented by the symbol $K_1$ and is generally defined by the slope of the voltage transfer curve 226. By suitably arranging the gain of the second stage 202 to be somewhat smaller than the gain $K_1$ the voltage transfer curve 230 of the amplifier transistor 206 may be obtained, having a predetermined slope representative of the gain of the second stage and designated by the symbol $K_2$, as shown. However, since the input voltage of the second stage 202 is equal to the voltage $V_{GS1}$, the bias point or operating level of the second stage has the same ordinate as that of the first stage. Accordingly, the output voltage $V_Q$ of the second stage may be readily determined by merely ascertaining the location of the ordinate $V_{GS1}$ on the transfer curve 230 of the second stage. This point is designated by the reference numeral 232. Consequently, the voltage level which appears across the output of the second stage is substantially elevated or shifted upwardly in magnitude with respect to that of the first stage, and although the gain of the second stage is somewhat lower than that of the first stage, it nevertheless operates at a substantially elevated voltage level, which is arranged to be sufficient to directly drive the source follower output stage 222. Thus, it may be seen that a substantial elevation in the output voltage level of the second stage 202 is accomplished, while directly coupling this stage to the first stage, without requiring the provision of a breakdown diode or other such device to elevate the voltage level to a level sufficient to drive the source follower output stage. The voltage $V_Q$ then appears at the output of the second stage 202 between its source 212 and its drain 210, and is then directly coupled to the source follower stage 222 through a conductor 234.

The advantages of providing the source follower stage 222 have been previously set forth. The stage 222 generally includes a source follower transistor 236, having a gate 238, coupled to the drain 212 of the amplifier transistor 206, a drain 240 connected in parallel with the load resistors 214 and 26 and with the negative voltage supply $V_{DD}$, and a source 242, which is connected to a load transistor 244. The load transistor 244 represents a relatively high impedance output resistance against which the source 242 must work, and an output electrode 246 is connected across the load transistor 244 for supplying the amplified output of the circuit to an external load.

Thus, the circuit illustrated in FIGURE 5 in which direct coupling is effected between the various stages provides an advantageous and simplified arrangement for elevating the voltage level of the first two stages to a sufficient level to drive the source follower output stage.

In accordance with the foregoing description, various embodiments of a novel and improved, high-gain, stable integrated circuit amplifier, requiring no external resistors or capacitors, has been provided.

Although preferred embodiments of the present invention have been described in detail, it should be understood that various modifications and changes will be readily apparent to one skilled in the art, and such changes and modifications are deemed to be within the spirit and scope of the invention.

What is claimed is:

1. A high-gain integrated circuit amplifier comprising a metal-oxide-semiconductor field effect transistor amplifier element having a gate, a source, and a drain, a metal-oxide-semiconductor coupling capacitor connected to said gate for supplying input signals thereto, bias means connected between said gate and said drain of said amplifier element including at least one pair of parallel reverse connected diodes, and a high impedance load adapted to adjust the gain of said amplifier element, said load being connected in parallel relationship with said drain of said amplifier element.

2. A high-gain integrated circuit amplifier in accordance with claim 1 wherein said bias means includes an input end and an output end, said input end being connected in parallel relationship with said gate and with said metal-oxide-semiconductor coupling capacitor, said output end being connected in parallel relationship with said load and said drain of said amplifier element.

3. A high-gain integrated circuit amplifier comprising a metal-oxide-semiconductor field effect transistor amplifier element having a gate, a source, and a drain, a metal-oxide-semiconductor coupling capacitor for supplying input signals to said gate, bias means coupled to said gate of said amplifier element including at least one pair of parallel reverse connected feedback diodes having an input end connected in parallel relationship with said gate and with said metal-oxide-semiconductor coupling capacitor and having an output end, said input end and said output end of said feedback diodes being maintained at approximately the same voltage level, and a high impedance load adapted to adjust the gain of said amplifier element and being connected in parallel relationship with said output end of said feedback diodes and with said drain of said amplifier element, whereby the drain voltage and the gate voltage applied to said amplifier element are substantially equal in magnitude.

4. An amplifier in accordance with claim 3 wherein said high impedance load comprises a metal-oxide-semiconductor field effect transistor having a drain, a gate electrically connected to said drain, and a source electrically connected in parallel relationship with said output end of said pair of feedback diodes.

5. An amplifier in accordance with claim 4 wherein said metal-oxide-semiconductor field effect transistor amplifier element, said metal-oxide-semiconductor capacitor, said high impedance load, and said feedback diodes are all formed on a single semiconductor wafer.

6. A high-gain integrated circuit amplifier in accordance with claim 4 wherein said metal-oxide-semiconductor capacitor comprises a first plate of semiconductor material, a layer of an oxide dielectric, and a second plate of metallic contact material separated from said first plate by said oxide dielectric, said first plate being adapted to be coupled to a source of input signals and said second plate being connected in parallel relationship with said input end of said feedback diodes and with said gate of said amplifier element.

7. A high-gain integrated circuit amplifier comprising:

(a) an N conductivity-type silicon substrate, (b) a metal-oxide-semiconductor field effect transistor amplifier including a source formed by a P conductivity-type region beneath one surface of said substrate, a drain formed by a second P conductivity-type region beneath said one surface of said substrate and closely spaced from said source, an insulating oxide layer disposed on a predetermined portion of said surface of said substrate including that portion of said surface extending between said source and said drain, and a gate formed by a layer of contact metal disposed on a portion of said insulating oxide layer extending between said source and said drain, (c) a metal oxide-semiconductor coupling capacitor including a first plate formed by a third P conductivity-type region beneath said surface of said substrate, said first plate being adapted to be connected to a source of input signals, an oxide dielectric layer disposed over a predetermined portion of said third P conductivity-type region, and a second plate formed of metal and separated from said first plate by said oxide dielectric layer, said second plate being connected to said gate of said transistor amplifier.

(d) a pair of parallel reverse connected feedback diodes connected between said gate and said drain of said transistor amplifier and including a first diffused-junction diode having an anode formed by a fourth P conductivity-type region beneath said surface of said substrate and having a cathode formed by an N+ conductivity-type region formed within said fourth P conductivity-type region and a second diffused junction diode having an anode formed by a fifth P conductivity-type region beneath said surface of said substrate and having a cathode formed by an N+ conductivity-type region formed within said fifth P conductivity-type region, and (e) a metal-oxide-semiconductor field effect transistor load resistor including a source common with said drain of said transistor amplifier, a drain formed by a sixth P conductivity-type region beneath said surface of said substrate and spaced a substantial distance from said source, an insulating oxide layer disposed on the surface of the substrate between said source and said drain, and a gate formed by a layer of contact metal disposed on a portion of said insulating oxide layer, said gate being electrically connected to said drain of said transistor load resistor.

8. An integrated circuit amplifier in accordance with claim 7 wherein said anode of said first diode and said cathode of said second diode are connected in parallel relationship with said gate of said amplifier transistor and with said second plate of said coupling capacitor and wherein said cathode of said first diode and said anode of said second diode are connected in parallel relationship with said drain of said amplifier transistor.

9. A multistage high gain integrated circuit amplifier comprising:

(a) a first stage including a first metal-oxide-semiconductor field effect transistor amplifier element having a gate, a source, and a drain, a first metal-oxide-semiconductor coupling capacitor connected to supply input signals to said gate, first bias means connected to said gate of said first transistor amplifier element including at least one pair of parallel, reverse connected feedback diodes, said first bias means having an input connected in parallel relationship with said gate of said first transistor amplifier element and with said first metal-oxide-semiconductor coupling capacitor and having an output, said input and said output being maintained at substantially the same voltage level, a first metal-oxide-semiconductor field effect transistor load resistor having a source, a drain, and a gate, said gate of said first transistor load resistor being electrically connected to said drain of said first transistor load resistor and said source of said first transistor load resistor being electrically connected in parallel relationship with said output of said first bias means and with said drain of said first transistor amplifier element, (b) a second stage including a second metal-oxide-semiconductor field effect transistor amplifier element having a gate, a source, and a drain, a second metal-oxide-semiconductor coupling capacitor connecting said gate of said second transistor amplifier element and said drain of said first transistor amplifier, second bias means including at least two pairs of parallel, reverse connected feedback diodes, said second bias means having an input connected in parallel with said second metal-oxide-semiconductor coupling capacitor and said gate of said second transistor amplifier and having an output, said input and said output being maintained at substantially the same voltage level, a second metal-oxide-semiconductor field effect transistor load resistor having a source, a drain, and a gate, said gate of said second transistor load resistor being connected in parallel relationship to said drain of said second transistor load resistor and said gate of said first transistor load resistor said source of said second transistor load resistor being connected in parallel relationship with said output of said second bias means and said drain of said second transistor amplifier, (c) a third stage including a third metal-oxide-semiconductor field effect transistor amplifier element having a gate, a source, and a drain, a third metal-oxide-semiconductor coupling capacitor connecting said gate of said third transistor amplifier element and said drain of said second transistor amplifier, third bias means including at least one pair of series reverse connected feedback diodes, said third bias means having an input connected in parallel with said third metal-oxide-semiconductor coupling capacitor and said gate of said third amplifier transistor and having an output, a third metal-oxide semiconductor field effect transistor load resistor having a source, a drain, and a gate, said gate of said third transistor load resistor being connected in parallel relationship to said drain of said third transistor load resistor and said gate of said second transistor load resistor, said source of said third transistor load resistor being connected in parallel relationship with said output of said third bias means and said drain of said third transistor amplifier, and (d) means coupled to said drain of said third transistor amplifier for elevating the level of output signals supplied by said third amplifier transistor and for supplying said signals to a load.

10. An integrated circuit amplifier in accordance with claim 9 wherein said first, second, and third metal-oxide-semiconductor coupling capacitors each comprise a first plate of semiconductor material, a second plate of metallic contact material, and an oxide dielectric layer separating said first plate and said second plate and wherein said metal-oxide-semiconductor capacitors are arranged such that the respective second plates of metallic contact material of each of said first, second, and third metal-oxide-semiconductor coupling capacitors are respectively connected to the gates of said first, second, and third metal-oxide-semiconductor transistor amplifiers, thereby precluding the application of a positive voltage to said respective gates.

11. An integrated circuit amplifier in accordance with claim 9 wherein said means for increasing the level of output signals and supplying said signals to a load comprises:

(a) a breakdown diode having a cathode and an anode, said cathode being connected in parallel relationship with said drain of said third amplifier transistor, (b) a fourth metal-oxide-semiconductor transistor load resistor having a source, a drain, and a gate, said drain and said gate of said fourth transistor load resistor being connected in parallel relationship with said gate of said third metal-oxide-semiconductor transistor load resistor, said source of said fourth transistor load resistor being connected to said anode of said breakdown diode, and (c) a source follower stage coupled to said breakdown diode.

12. An integrated circuit amplifier in accordance with claim 11 wherein said source follower stage comprises:

(a) a source follower metal-oxide-semiconductor field effect transistor having a gate connected to said anode of said breakdown diode, a drain connected to said gate of said fourth transistor load resistor, and a source adapted to be connected to an external load, and (b) a load transistor connected to said source of said source follower transistor.

13. A multistage high gain integrated circuit amplifier comprising:

(a) a first stage having a first predetermined gain and including a first metal-oxide-semiconductor field effect transistor amplifier element having a gate, a source, and a drain, a first metal-oxide-semiconductor coupling capacitor for supplying input signals to said gate, bias means connected to said gate of said first transistor amplifier element including at least one pair of parallel, reverse connected feedback diodes, said bias means having an input connected in parallel relationship to said gate and to said first metal-oxide-semiconductor coupling capacitor and having an output connected to said drain, said input and said output being maintained at substantially the same voltage level, whereby the voltage at said gate and the voltage at said drain are substantially equal, a first metal-oxide-semiconductor field effect transistor load resistor having a source, a drain, and a gate, said gate of said first transistor load resistor being electrically connected to said drain of said first transistor load resistor and said source of said first transistor load resistor being electrically connected in parallel relationship with said output of said bias means and with said drain of said first transistor amplifier element, (b) a second stage having a second predetermined gain lower in magnitude than said first predetermined gain and including a second metal-oxide-semiconductor field effect transistor amplifier element having a gate, a source, and a drain and a second metal-oxide-semiconductor field effect transistor load resistor having a source, a drain, and a gate, said gate of said second transistor load resistor being connected to said drain of said load transistor and said source of said second transistor load resistor being coupled to said drain of said second transistor amplifier, (c) means for directly coupling said drain of said first transistor amplifier to said gate of said second transistor amplifier, thereby effecting the application of a voltage signal to said gate of said second amplifier transistor substantially equal to the voltage signal applied to said gate of said first amplifier transistor, whereby the output voltage level at said drain of said second amplifier transistor is substantially elevated, and (d) a source follower output stage coupled to said drain of said second amplifier transistor.

References Cited

UNITED STATES PATENTS 3,278,853 10/1966 Lin -------------- 330—40 X

ROY LAKE, *Primary Examiner.*

JAMES B. MULLINS, *Assistant Examiner.*

U.S. Cl. X.R.

330—24, 28, 29, 22, 35, 38